United States Patent [19]

Dushane et al.

[11] Patent Number: 5,109,200
[45] Date of Patent: Apr. 28, 1992

[54] ELECTRICALLY SELF-ADJUSTING, COMPACT AND LIGHT-WEIGHT REMOTE CIRCUIT TESTER

[76] Inventors: Steven D. Dushane, 17170 Los Alamos St., Granada Hills, Calif. 91344; Irving H. Zaroff, 17335 Knapp St., Northridge, Calif. 91324; Grant E. Bohm, 15701 Ranchland Dr., Redding, Calif. 96001; Dennis L. Dushane, 8845 Rubio, Sepulveda, Calif. 91343; Robert A. Dushane, 17421 Knapp St., Northridge, Calif. 91324; Kenneth K. Anderson, 5358 Birchcroft, Simi Valley, Calif. 93063

[21] Appl. No.: 610,280

[22] Filed: Nov. 6, 1990

[51] Int. Cl.$^5$ ............................................. G01R 31/02
[52] U.S. Cl. ..................................... 324/508; 324/66; 340/531; 340/656
[58] Field of Search ................. 324/508, 611, 609, 66; 340/654, 656, 538, 531

[56] References Cited

U.S. PATENT DOCUMENTS

| | | | |
|---|---|---|---|
| 4,095,212 | 6/1978 | Pruitt | 324/508 X |
| 4,801,868 | 1/1989 | Brooks | 324/66 |
| 4,906,938 | 3/1990 | Konopka | 324/66 X |
| 4,945,346 | 7/1990 | Schmiemann | 324/508 X |

Primary Examiner—Kenneth A. Wieder
Attorney, Agent, or Firm—Poms, Smith, Lande & Rose

[57] ABSTRACT

A circuit tester includes a light-weight portable transmitter and receiver, with the transmitter being provided with several interchangeable plugs for the testing of power circuits of different voltage. The plugs are alternately firmly electrically and mechanically coupled to apply power to the transmitter, which does not need a battery. The transmitter transmission circuitry operates on a relatively low voltage such as 9 volts, and the transmitter input circuitry operates without switching circuits to reduce the applied power to this operating level. The transmitter only weighs 2½ or 3 ounces and the receiver only weighs 7 or 8 ounces. Unique modulation or interruption of the transmitter operates audio and/or visual signalling elements in the receiver.

24 Claims, 3 Drawing Sheets

ELECTRICALLY SELF-ADJUSTING, COMPACT AND LIGHT-WEIGHT REMOTE CIRCUIT TESTER

FIELD OF THE INVENTION

This invention relates to a circuit tester which enables a user to test the electrical state of remote electrical outlets and sockets and which is light-weight and compact enough to make it easily portable.

BACKGROUND OF THE INVENTION

Every homeowner and electrician is familiar with the problem of determining which of several fuses or circuit breakers in a large array corresponds to an outlet or appliance in a separate room or in some other location out of sight. For example, assume that one wishes to know which circuit breaker controls the power to the outlet into which a bedroom lamp is plugged. Most people faced with this task are consigned to having to stand at the circuit breaker panel and use trial and error, and several trips back and forth to the outlet in question, in order to determine which circuit breaker controls the outlet.

U.S. Pat. No. 4,095,212 (Pruitt, Jun. 13, 1978) describes a remote electric state tester. With the Pruitt tester, the user plugs a transmitter unit into the outlet in question and then carries a receiver unit to the circuit breaker of fuse panel. As long as the units are working properly and there is electrical power being supplied through the outlet, the transmitter sends a continuous signal to the receiver, which in turn activates a steady indicator light as long as the receiver senses the signal. The user may remain at the circuit breaker or fuse panel, and when he disconnects the right circuit to cut off power to the outlet, the transmitter stps transmitting. If all is working well, the user will then know he has found the right circuit breaker or fuse because the indicator light will go out.

The Pruitt tester has several weaknesses, both in terms of reliability and of convenience. First, the transmitter described in the Pruitt patent requires separate pairs of input terminals for high- and low-voltage AC power from the tested outlet. When the test outlet has high-voltage AC, the user must manually switch the transmitter to the terminals which feed a transformer which is coupled to either an AC relay or to a DC relay which further requires the input power to be at least half-wave rectified and smoothed.

The user of the Pruitt device must consequently know or determine ahead of time whether the test current is in the correct "high" or "low" voltage range relative to the transmitter, and he must manually set the switch accordingly. The unit itself relies on standard electromechanical relays, and especially in a dusty, dirty, and occasionally damp construction or industrial environment such relays and/or their contacts may become soiled and useless.

An additional disadvantage of the Pruitt device is that the AC input circuit of the transmitter unit is electrically isolated from the actual RF transmission circuit, with the only connection being via a relay. Because of this, a separate battery must be provided in the transmitter unit to power the transmission circuit, and a separate test switch is needed to be able to test the strength of the battery. In other words, not only is the Pruitt transmitter not compact and light-weight enough to be convenient, the user must also make sure to have a sufficiently fresh battery in the unit, and to open and close the unit when the battery must be changed. This problem is all the more acute in the Pruitt receiver unit, which separates its reception circuitry from its indication circuitry, and which consequently requires separate batteries and check switches for each circuit. The Pruitt device as disclosed thus needs three separate batteries for proper operation.

Furthermore, the Pruitt transmitter unit is shown as being a floor unit connected to the test outlet by means of an electrical cord. Although necessary because of the weight of the ferrous components such as the transformer and relays, this means that the unit is not compact enough for the user to carry easily, for example in his or her pocket. The usefulness of the Pruitt tester is further reduced by the fact that no provision is made to adapt the tester to outlets which use different kinds of socket holes, for example, three-pronged as well as two-pronged, flat blades as in the U.S. as well as pins as in Europe, screw-in sockets as well as plug-in, etc.

The Pruitt device also includes a switch for testing the receiver's indicator light. By closing this switch, the indicator light is connected directly to the battery and, if whole, will light up. This feature allows the user to test the light, but it is inadequate. If the user is standing at the fuse box and the indicator light is shining, he will assume there is power at the test outlet. If, however, the relay which is also required in the receiver is not working properly, the indicator light may continue to shine even though the test outlet has been disconnected.

It is consequently the object of this invention to provide a remote circuit tester which is light-weight, compact, and easily adaptable to different test outlets and appliances.

Another object of the invention is to provide a remote circuit tester which automatically adjusts to the level of the input current, delivers robust and highly reliable performance and security, using non-mechanical components, and which needs at most only a single battery.

SUMMARY OF THE INVENTION

In an illustrative embodiment of the invention, the transmitter includes arrangements for readily testing power circuits from 9 volts up to at least 220 volts. Further, the transmitter is powered by the power circuit being tested and needs no batteries; and also requires no input switching to accommodate changes in the voltage levels of the input circuits being tested.

A series of plugs is provided to accommodate the testing of different types of power circuits, for examples, (1) two-prong plugs, (2) three-prong plugs (3) alligator clips or (4) threaded bulb type plugs. These plugs may be alternatively mechanically and electrically coupled to the transmitter, with the preferable manner involving a receptacle on the transmitter, and mating flanges on the plugs for positively and firmly engaging the receptacle on the transmitter.

Both the transmitter and receiver are compact and light in weight, with each weighing less than a pound and preferably less than a half pound. One operating prototype included a transmitter which weighed about 2½ or 3 ounces and a receiver weighing about 7½ ounces.

The transmitter may operate at any desired frequency, with a frequency in the hundreds of megacycles being preferred. The signal may be modulated or interrupted in a unique manner capable of human perception, to preclude operation of the receiver by an unwanted radio frequency signal.

The receiver may include either or both a visual and an audio signalling element, and they may be connected in series, if desired.

DETAILED DESCRIPTION

Figure 1:
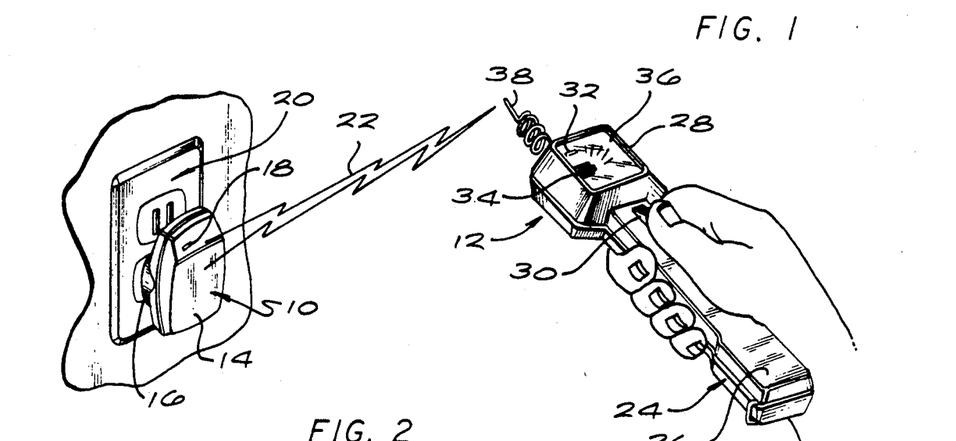
FIG. 1 illustrates the operation of the circuit tester according to the invention.

According to the invention, the circuit tester includes a transmitter and a receiver, which are designated generally in FIG. 1 with reference numerals 10 and 12, respectively. The transmitter 10 includes a housing 14, a plug adapter 16, and a check light 18, and is provided in the manner described below to be connected electrically with the electrical conductors in a test object such as an electrical socket 20, an appliance, or some other component whose corresponding fuse or circuit breaker one wishes to identify. As indicated symbolically by the "lightning bolt" 22, the connection between the transmitter 10 and receiver 12 is preferably wireless.

The receiver 12 includes a housing 24 with a handle portion 26 and a head portion 28. The handle portion 26 is preferably shaped as a slender grip with a suitable indentations or restriction for the fingers so the user can hold it comfortably. An ON-OFF switch 30 is preferably included either in the handle portion 26, in which case it is preferably a sliding contact switch positioned near where the users thumb will lie when the user holds the receiver, or in the head portion 28. An indicator light 32 and an optional beeper 34 of conventional type are preferably mounted in an indicator face surface 36 of the head portion 28. The receiver is also provided with an antenna 38, which may either be externally mounted as shown in FIG. 1, or mounted within the receiver housing 24 in a conventional manner.

The transmitter housing 14 and the receiver housing 24 are both preferably made of a highly impact-resistant plastic or other material for housing their respective electronic circuit boards and other components described below. Each housing 14, 24 is preferably manufactured as a two-piece (upper-lower), sturdy, snap-together unit to provide a tight seal against dirt, dust and moisture, but yet to allow them to be opened and reclosed for easy repair and, in the case of the receiver, to change a battery. Other joining arrangements such as screws are of course also possible.

Figures 2, 3, 4, 5, 6, 7:
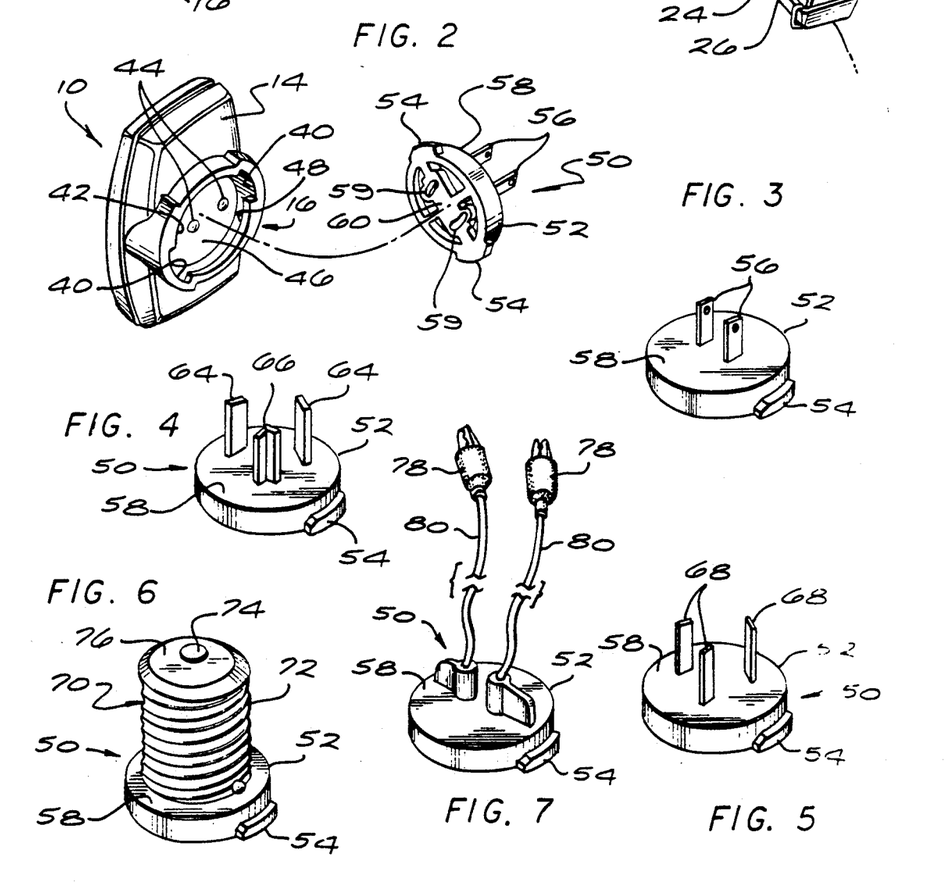
FIG. 2 illustrates an advantageous plug adapter included according to the invention in a transmitter unit.
FIGS. 3-7 show examples of various test plugs which may be fitted to the transmitter unit of the circuit tester according to the invention.

As FIG. 2 illustrates, the plug adapter 16 is either secured to the transmitter housing 14, or, preferably, is molded as a unit with it, and which in either case is preferably made of the same material as the transmitter housing. The plug adapter 16 is shaped generally as an annular locking ring or bayonett mount, with opposing recesses 40 on either side of radially inwardly extending lips 42. Terminal contacts 44 are mounted in suitable openings in a mounting surface 46 of the transmitter housing 14. The terminal contacts 44 form the input terminals to the transmitter circuit described below.

Although two terminal contacts 44 are shown in FIG. 2, three or more may also be included depending on the type of circuit one wishes to test. Normally, however, since the terminal contacts are needed only to deliver single-phase power to the transmitter, two terminal contacts will suffice.

A stop dog 48 is furthermore preferably provided under at least one lip 42.

FIGS. 2 and 3 illustrate a plug, which is designated generally by the reference numeral 50. The plug 50 includes a mainly disk-shaped base 52, with opposing, outwardly extending locking tabs 54. Electrical contacts or contact prongs 56 extend out from an outer surface 58 of the base 52, with inner contacts 59 which protrude slightly from the opposite mounting surface 60 of the base 52. Although the inner contacts 59 may simply be inner contact ends of the contact prongs 56, they may also be separate contacts connected electrically in a known manner with the contacts 56, for example using conductors included within the base 52.

As FIG. 2 indicates by the dashed line 62, the plug 50 is attached to the plug adapter 16 of the transmitter 10 by inserting the locking tabs 54 into the recesses 40, so that the mounting surface of the plug base 52 is parallel with and close to the transmitter mounting surface 46. The user then turns the plug 50 relative to the transmitter housing 14 so that the locking tabs 54 slide with a snug and secure fit between the lips 42 and the mounting surface 46, until at least one of the tabs 54 is stopped by the stop dog 48. The plug is then in a mounted position, in which the inner contact ends 59 of the plug 50 each contact a respective one of the terminal contacts 44. When the plug is thus mounted, there is therefore direct electrical contact between the contacts 56 and the input terminals of the transmitter 10.

In FIGS. 2 and 3, the plug is shown as being two-pronged, with flat blade contacts typical in most American homes and offices. Substantially cylindrical pins, typically used in many European and other foreign plugs, may of course be included instead of the flat blade contacts.

FIGS. 4-7 illustrate other embodiments of the plug, with common features given the same reference numerals. FIG. 4 illustrates a triple-contact arrangement commonly found in industrial setting, with two flat blade contacts 64 and one right-angle ground or alignment contact 66. FIG. 5 shows another common arrangement, in which all three of the contacts 68 are flat blade contacts.

FIG. 6 illustrates a plug designed for when the user wishes to test a lamp socket. One should note that because of the light weight and compactness of the circuit tester according to the invention, this lamp socket may also be a ceiling fitting such as is common in kitchens. In the plug as shown in FIG. 6, the contacts extending from the base 52 are arranged as in the base of a typical light bulb, with a mainly cylindrical outer contact body 70 having a threaded surface 72, and with an inner contact 74 within the outer contact body 70 which protrudes above an insulating surface 76. Because the transmitter according to this invention is both compact and light, it is possible for the user simply to mount the plug onto the transmitter housing 14 as described above and to screw the transmitter using the outer contact body 70 into the socket to be tested just as he would a light bulb.

FIG. 7 illustrates a plug which can be mounted onto the transmitter when the user wants to test a circuit which has no socket, or which has a socket for which the user has no plug with suitably arranged protruding contacts. In this embodiment, the contacts are for example alligator clips 78, probes, etc., which are connected to the inner contact ends 59 (FIG. 2) by conventional leads 80.

The embodiments of the plug 50 and contacts shown in FIGS. 2-7 are merely examples of the many contact arrangements which are made possible according to the invention. Other shapes, numbers, placement in the base 52, etc., for the contacts are equally possible according to the invention, the only practical limitation being that they fit in or on, or can in some way be connected to, the base 52.

Figure 8:
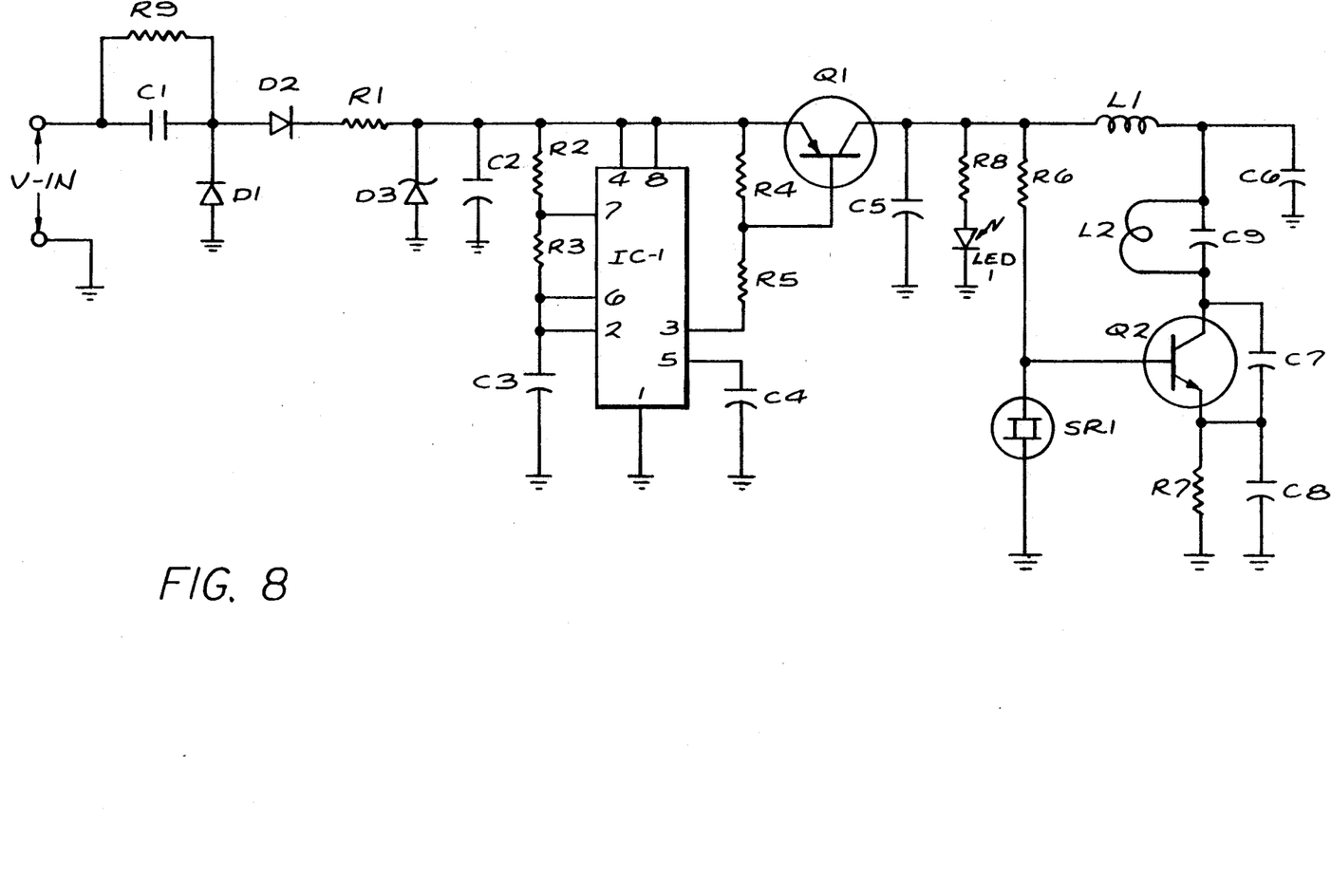
FIG. 8 is a circuit diagram of an exemplifying embodiment of the transmitter unit according to the invention.

FIG. 8 is a circuit diagram of a preferred embodiment of the transmitter according to the invention. As described above, the transmitter is connected electrically with the contacts of a socket or plug. Via the terminal contacts 44 (see FIG. 2) there is thus an electrical input voltage to the transmitter as long as the socket itself is powered. This electrical input voltage enters the transmitter circuit via the contacts marked V-IN. A capacitor C1, a resistor R9, a back-biased diode D1 to ground, and a forward-biased diode D2 form an input filter and half-wave rectifier for the input voltage signal. This rectified and smoothed input signal is led to ground through a Zener D3 and, in parallel, a capacitor C2. The Zener diode D3 is chosen so as to limit the input voltage to approximately 9 volts. The capacitor C2, which preferably has a large capacitance, is therefore able to charge to 9 volts during normal operation.

A resistor R2, a resistor R3, and a capacitor C3 form a network for voltage division. The resistor R3 and the capacitor C3 establish the time constant for an oscillator IC-1. In the preferred embodiment, the oscillator IC-1 consists of a well-known No. 555 integrated circuit timer. Design of circuitry using a 555 IC timer is well-known in the field; consequently, the choice of values and configuration of the resistors and capacitors connected to the various pins of the oscillator IC-1 are not described further. For understanding of the invention, it is sufficient to note that the timer, using standard design methods and choices, produces an output pulse at its output pin 3 which changes state between its "high" and "low" voltage levels approximately four times a second. As will become apparent below, this frequency may be varied as desired, but is preferably kept within the frequency range of normal human perception.

The output pulse from pin 3 of the oscillator IC-1 is connected via a voltage divider consisting of resistors R4 and R5 to the base of a first transistor Q1. The transistor Q1 constitutes the solid-state on-off switch for the following transmission circuitry. The on-off switching of the transistor Q1 will naturally follow the approximately 4 Hz pulsed signal generated by the oscillator IC-1. One should, however, note that when the transistor Q1 is in its conductive state, electrical current will flow through it, but that when the transistor Q1 is in its non-conductive state, it will isolate the circuitry to its right in FIG. 8 from the supply of electrical current stored as the charge for the capacitor C2 and entering the circuitry through the AC input terminals.

A capacitor C5 connects the collector of the transistor Q1 to ground and forms a filter to eliminate transients. The collector output signal from the transistor Q1 is also connected via a resistor R8 to a light-emitting diode LED-1 which is the check light 18 shown in FIG. 1. The LED-1 will thus blink as long as electrical power is entering the circuitry from the test socket or appliance, and as long as the oscillator and the transistor Q1 are functioning properly. The LED-1 thus indicates to the user the state of the transmitter.

The collector of the transistor Q1 is also connected to a transmission circuit which will now be described. Via a resistor R6, the pulsed output signal from the transistor Q1 is connected to ground via a surface acoustic wave resonator SR1, for example, the Model MPS 571 8-10, and also to the base of a transistor Q2. The pulsed collector output signal from the transistor Q1 is also connected to the collector of the transistor Q2 via a first inductor L1, and via a resonance circuit consisting of the parallel connection between a capacitor C9 and a coil L2. The inductor L1 is provided in order to prevent RF energy from passing to the power supply.

Since electrical energy is fed into the transmission circuitry in the form of pulses from the collector of the transistor Q1, the transmission circuitry will generate an RF signal in the form of a pulsed signal, with the frequency of the pulses being equal to the frequency of the output pulses from the oscillator IC-1. Transients are further filtered out by a capacitor C6. Components C7, C8, C9 and R7 in conjunction with coil L2 are chosen to guarantee that the oscillator transistor, Q2, will operate at the desired frequency of the surface acoustic wave resonator, SR1.

Figure 9:
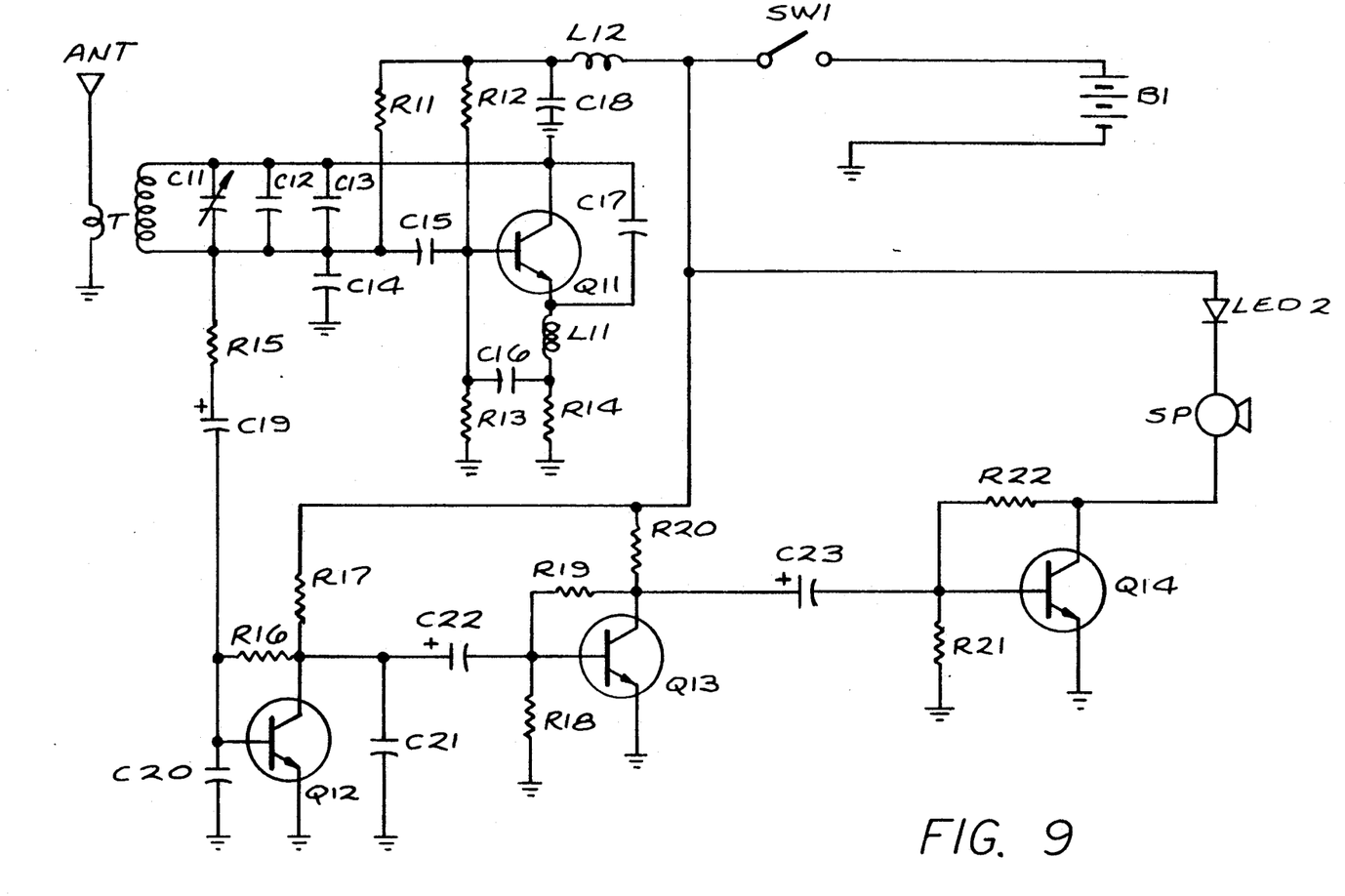
FIG. 9 is a circuit diagram of an exemplifying embodiment of the receiver unit according to the invention.

FIG. 9 is a circuit diagram of the receiver. The RF energy generated as pulses by the transmitter is picked up via an antenna ANT, which corresponds to the antenna 38 shown in FIG. 1. The RF signal is converted using a conventional lightweight transformer T, and is fed to a receiver tuning circuit comprising transformer T, and capacitors C11 through C14. As FIG. 9 illustrates, the input capacitor C11 is preferably adjustable in order to tune the receiver to the frequency of the transmitter. The remaining components of the reception circuitry in the receiver include a transistor Q11 and various resistors, capacitors, and inductors as is well understood in the art of designing high-frequency oscillation circuits in receivers. The operation of the reception circuitry is therefore not discussed in further detail.

It is not necessary for the reception circuitry to have the exact configuration or components shown in FIG. 9; rather, any known, preferably simple reception circuit may be used in the receiver according to the invention as long as it produces a detectable pulsed output. According to the invention, the reception circuitry is necessary only to demodulate the RF signal transmitted by the transmitter in order to produce a bi-stable output signal with a frequency corresponding to the output frequency of the oscillator IC1 (see FIG. 8) in the transmitter.

Referring to FIG. 9, the received, demodulated input signal to the receiver is passed via a resistor R15 and a coupling capacitor C19 to a first stage including the transistor Q12. The signal at the collector of the transistor Q12 is substantially a square-wave signal of low amplitude. This signal is amplified by a second stage including the transistor Q13. Both the transistors Q12 and Q13 are provided with conventional capacitive and resistive elements so as to operate as bi-stable elements, that is, to alternate between their fully conductive and fully non-conductive states.

Power to drive the reception circuitry, to feed the collectors of the transitors Q12 and Q13, and to supply indication circuitry described below, is provided by a battery B1. A switch SW1 is preferably provided in series with the battery and forms an on-off switch for the receiver. This switch SW1 is the electrical equivalent of the switch 30 shown in FIG. 1.

The signal present at the collector of the transistor Q13 will therefore be an amplified square-wave signal with a frequency equal to, or at least corresponding to, that of the oscillator IC-1 in the transmitter (see FIG. 8). This pulsed signal is connected via a coupling capacitor C23 to the base of a drive transistor Q14. When the transistor Q14 is in its conductive state, a circuit is formed from the battery B1, via the switch SW1, through a light-emitting diode LED-2, through a beeping element SP, and through the transistor Q14 itself. The light-emitting diode LED-1 is the electrical equivalent of the blinker 34 shown in FIG. 1. The beeping element SP is of course the equivalent of the beeper 34 also shown in FIG. 1.

As long as the transistor Q14 is conductive, both the LED and the beeping element will therefore be activated. When the transistor Q14 is not conductive, however, both the light-emitting diode LED-2 and the beeping element SP will be inactive. This means simply that the light-emitting diode LED-2 will blink, and the beeping element SP will beep, at the same frequency as the output frequency of the oscillator IC1 (see FIG. 8). Of course, by choosing frequency-multiplying or -dividing circuitry, the frequency of the blinker and beeper can be changed, but by choosing the frequency of blinking and beeping to be approximately four times a second, such circuitry is not necessary to produce easily visible and audible signals for the user.

The beeping element SP is preferably a piezo-audio ceramic membrane of a known type which will beep at approximately 1500 to 4000 Hz. It is to be understood that it is not necessary to include both audible and visible signals to indicate to the user when there is electrical power at the outlet or socket to be tested. Either the light-emitting diode LED-2 or the beeping element SP may therefore be omitted. Furthermore, these two indicators may be connected in parallel, rather than in series as is shown in FIG. 9, with appropriate series resistors, so that they are operated at appropriate power levels. It has been determined, however, using commercially available LED and beepers, that they may operate satisfactorily in series, as shown. Also, other beepers or lights may be used instead of the ones described in this preferred embodiment.

The battery B1 in a working prototype was a standard 9-volt battery. Such a standard 9-volt battery is compact and light enough, while still providing electrical power at a useful and standard voltage, to allow the hand-held receiver to be correspondingly compact and light.

Both the transmitter circuitry and the receiver circuitry shown in FIGS. 8 and 9 respectively, may be manufactured on small circuit boards, so as to fit into the small transmitter and receiver housing 14 and 24, respectively (see FIG. 1). In the case of the receiver circuits, the board typically will be enclosed within the head portion 28.

Having now described the circuitry of the preferred embodiment of the transmitter and receiver according to the invention, the advantages of the invention will now be more apparent. With reference to FIGS. 8 and 9, the voltage limiting function of the Zener diode D3 eliminates the need for separate transformers or switching circuits. Instead, as long as the input voltage is not greater than the rated capacity (preferably from 9 V to at least 220 V) of the Zener diode D3, the voltage to the remaining transmitter circuit will be kept at a fairly constant 9 volts, (depending upon the values chosen for the Zener diode D3, and the capacitor C2). Furthermore, although the input voltage from test sockets, outlets, appliances, etc. will typically be AC with a voltage much higher than 9 volts, it is also possible to use the invention when testing DC circuits. If the circuit is connected to a DC supply, the capacitor C1 will, of course, not pass the input signal. On the other hand, the input voltage or signal will bypass this capacitor via the resistor R9, and will pass directly through diode D2 to the limiting circuitry formed by the Zener diode D3 and the charging and time constant circuitry formed by the capacitor C2 and the RC network connected to the input pins of the oscillator chip IC1.

Regardless of the type of current to which the transistor is connected, however, one should note that it is not necessary to include a separate battery or power source in the transmitter. Rather, the transmitter uses the power from the test socket itself. Furthermore, one should note that no mechanical relays, transformers, or other typically relatively heavy elements are included in the transmitter. It is thus possible to make the transmitter according to the invention both compact and light enough to plug directly into sockets and to carry it easily in one's pocket or work bag.

Referring to FIG. 1, the typical manner of use of the invention will now be described. Assume that the user wishes to test which circuit breaker corresponds to the outlet 20. The user simply plugs the transmitter into the outlet and as long as there is electrical power at the outlet, the transmitter check light 18 (LED-1 in FIG. 8) will blink at approximately 4 Hz. The user then switches on the receiver using the switch 30 (the switch SW1 in FIG. 9) and should then observe that the blinker 32 is blinking and the beeper 34 is beeping at approximately the same frequency. If this is so, it indicates to the user both that the transmitter is functioning properly, and that the receiver is receiving properly. One should note that if the receiver becomes short-circuited, it is extremely unlikely that the indicator light 32 will blink and the beeper 34 will beep at the proper frequency; more likely, they will emit continuous signals which in themselves will indicate some fault to the user.

Assume for the moment that the wiring of the house or installation is controlled via a circuit breaker. The user then goes to the circuit breaker panel carrying the receiver, and should observe that the indicators continue to blink and beep periodically. Throwing the circuit breakers one at a time, the user will note that the beeping and blinking continue until the circuit breaker controlling the outlet in question has been thrown. When the correct circuit breaker has been thrown, both the light 32 and the beeper 34 will be inactivated. The user will therefore have correctly identified the circuit breaker controlling the outlet in question. As added confirmation that the correct circuit breaker has been identified, the user may return to the transmitter and should see that the check light no longer is blinking. The check light 18 thus provides a test not only of whether there is power at the outlet, but also a test of the proper functioning of the transmitter itself. This added level of security is unavailable according to the prior art.

Assume now that the user wishes to test a lamp installed in a ceiling fixture. The user screws the screw-threaded transmitter plug (FIG. 6) transmitter into the lamp socket just as he would when installing a light bulb, and repeats the procedure described above in connection with the more typical wall outlet shown in FIG. 1. Of course, the other plugs may be used for different types of outlets with equal ease.

Incidentally, concerning certain specific details, it has been noted that the size of the transmitter and receiver units is small and that they are light in weight. Specifically, the transmitter unit without the plug adaptors is about 2½×3¾ inches, and is about 1 inch thick. It weighs about 2½ ounces. The receiver has a length including the antenna which is somewhat less than a foot, and the housing is somewhat less than 9 inches long with a maximum width of about 2¾ inches, and a thickness of about an inch. It weighs about 7½ ounces, including the battery. Although other freqencies could be used, the operating frequency is 303.875 megacycles, and the units operate over a distance of about 150 to 200 feet.

In conclusion, it is to be understood that the foregoing detailed description and the accompanying drawings relate to one preferred embodiment of the invention. Various changes and modifications may be made without departing from the spirit and scope of the invention. Thus, by way of example and not of limitation, the transmitter may be coupled to the various alternative plugs with the different conductive pin configurations by alternative arrangements, providing electrical and mechanical coupling. For specific example, the transmitter could be provided with outwardly extending conductive pins, and each of the alternative plugs could be provided with mating sockets, and the mechanical and electrical coupling or connections could be accomplished by plugging the transmitter into the alternative plugs. Other transmission frequencies could be used. The receiver could be provided with different, or only one signalling element. Various alternative circuits could be employed to accomplish the same functions, consistent with the features stressed hereinabove. Thus, instead of interrupting the output signals from the transmitter, these signals could be modulated at a frequency within the range of human perception for unique identification at the receiver. Accordingly, the present invention is not limited to the arrangements shown in the drawings and as described in detail hereinabove.

What is claimed is:

1. A remote circuit testing system for identifying de-energized electrical power circuits from a control point such as the fuse or circuit breaker power input box, said system comprising:
   a transmitter, said transmitter including circuit means for deriving its power solely from a power circuit to be tested, and for radiating radio frequency signals in a unique pattern when said transmitter is coupled to any input voltage from nine volts to at least 220 volts without any external switching arrangements;
   a plurality of plugs each having different conductive coupling arrangements for connection to different power circuits having different voltages to be tested;
   coupling means on said transmitter and on each of said plugs for mechanically and electrically firmly coupling each of said plugs, alternatively, to said transmitter, and for preventing simple linear removal of said plugs from said transmitter;
   signal means on said transmitter to indicate that the power circuit to be tested is powered, and that said transmitter is operative;
   a wireless receiver coupled to receive said radio frequency signals from said transmitter, said receiver including signalling means responsive to the unique pattern of the transmitted radio frequency signals; and
   said testing system including said transmitter and receiver having not more than one single battery;
   whereby the transmitter may be connected to the power circuit to be tested, and the receiver taken to a power control point, and deactivation of the power circuit under test may be verified.

2. A system as defined in claim 1 wherein said coupling means comprises:
   a receptacle on said transmitter for mechanically receiving a selected one of said plugs and for coupling conductive members extending through said plugs to input terminals for energizing said transmitter, said receptacle having an annular locking ring with opposing recesses on either side of radially inwardly extending lips; and
   said plugs having a substantially disk shaped base with opposing, outwardly extending locking tabs, said tabs being positioned to be received by said recesses, said plugs being firmly locked to said transmitter receptacle by manually turning said plug relative said transmitter.

3. A system as defined in claim 1 wherein one of said plugs has two conductive pins for plugging into a wall socket, and wherein another of said plugs has three conductive pins for plugging into a wall socket, and said system further including means for mounting the body of said transmitter transverse to the orientation of said pins to hang down in a substantially vertical orientation when said plugs are plugged into said wall socket.

4. A system as defined in claim 1 wherein additional plugs are provided having, respectively, electrical connections in a screw threaded bulb type configuration, and alligator clips associated therewith.

5. A system as defined in claim 1 wherein said transmitter provides output signals which are modulated or interrupted at a low frequency within the human range of perception.

6. A system as defined in claim 1 wherein said circuit means comprises:
   input means for limiting the input voltage to a low voltage such as about 9 volts, and for supplying voltage to said transmitter circuitry despite wide variations in the input voltage level supplied to said transmitter, said input means comprising a zener diode;
   oscillation means for generating a pulsed signal at a predetermined frequency only upon presence of electrical power at said power circuit; and
   transmission means for modulating said pulsed signal as said radio frequency signal and transmitting said radio frequency signal to said receiver.

7. A system as defined in claim 1 wherein said transmitter is small and compact and weighs less than one pound so that it may be readily plugged into a socket when the transmitter is physically secured to one of the plugs.

8. A system as defined in claim 1 wherein said transmitter is small and compact and weighs less than one-half pound so that it may be readily plugged into a socket when the transmitter is physically secured to one of the plugs.

9. A system as defined in claim 1 wherein said receiver signalling means includes an LED and a beeper.

10. A system as defined in claim 1 wherein the frequency of said radio frequency signal is approximately 300 megahertz.

11. A remote circuit tester comprising a transmitter and a wireless receiver for testing the electrical state of test circuits:

said transmitter including:
  a) a housing;
  b) cordless connection means for connecting the transmitter electrically to the test circuits even when the test circuits have different outlet contact configurations;
  c) switchless, automatic input voltage regulation means for generating a source of regulated electrical power to the transmitter from electrical power from any test circuit only when electrical power is present at the test circuit; and
  d) oscillation means for generating a pulsed transmission signal having a predetermined pulse frequency only when electrical power is present at the test circuit;

said receiver including:
  a) signal conversion means for converting the pulsed transmission signal into a two-state drive signal; and
  b) indication means for generating periodic indication signals to a user corresponding to the pulsed transmission signal.

12. A remote circuit tester as defined in claim 11, in which the cordless connection means includes external electrical contacts for connection directly with corresponding electrical outlet contacts contained in the test circuit and internal electrical contacts for electrically connecting transmitter input terminals to corresponding ones of the external electrical contacts.

13. A remote circuit tester as defined in claim 12, in which the cordless connection means further includes interchangeable connection plugs having different external electrical contact configurations, said tester including means for preventing direct linear removal of said plugs from said transmitter.

14. A remote circuit tester as defined in claim 13, in which the cordless connection means further includes plug adapter means on the transmitter housing for mechanically and electrically coupling each of said plugs, alternatively, to said transmitter.

15. A remote circuit tester as defined in claim 13, said external electrical contacts protruding outward and being substantially flat.

16. A remote circuit tester as defined in claim 13, in which an inner one of said external electrical contacts is separated by insulation from an outer one of said said external electrical contacts, which is a threaded, substantially cylindrical member protruding outward for screwing into an internally threaded socket of the test circuit.

17. A remote circuit tester as defined in claim 13, in which said external electrical contacts include clips and leads for testing a socket-less test circuit.

18. A remote circuit tester as defined in claim 11, in which the automatic input voltage regulation means includes a Zener diode.

19. A remote circuit tester as defined in claim 11, in which the indication means comprises a light-emitting element and pulsing circuitry for causing the light-emitting element to blink at the predetermined frequency.

20. A remote circuit tester as defined in claim 11, in which the indication means comprises a beeper and pulsing circuitry for causing the beeper to beep at the predetermined frequency.

21. A remote circuit tester as defined in claim 11, in which the transmitter further includes a test light for indicating proper operation of the oscillation means.

22. A remote circuit testing system for identifying de-energized electrical power circuits from a control point such as the fuse or circuit breaker power input box, said system comprising:

a transmitter, said transmitter including circuit means for deriving its power solely from a power circuit to be tested, and for radiating radio frequency signals in a unique pattern when said transmitter is coupled to any input voltage from nine volts to at least 220 volts without any external switching arrangements, said circuit means comprising:
  input means for limiting the input voltage to a low voltage such as about 9 volts, and for supplying voltage to said transmitter circuitry despite wide variations in the input voltage level supplied to said transmitter, said input means comprising a zener diode;
  oscillation means for generating a pulsed signal at a predetermined frequency only upon the presence of electrical power at said power circuit;
  transmission means for modulating said pulsed signal as said radio frequency signal and transmitting said radio frequency signal to said receiver;

a plurality of plugs each having different conductive coupling arrangements for connection to different power circuits having different voltages to be tested;

coupling means on said transmitter and on each of said plugs for mechanically and electrically firmly coupling each of said plugs, alternatively, to said transmitter, said coupling means comprising:
  a receptacle on said transmitter for mechanically receiving a selected one of said plugs and for coupling conductive members extending through said plugs to input terminals for energizing said transmitter, said receptacle having an annular locking ring with opposing recesses on either side of radially inwardly extending lips, said plugs having a substantially disk shaped base with opposing, outwardly extending locking tabs, said tabs being positioned to be received by said recesses, said plugs being firmly locked to said transmitter receptacle by manually turning said plug relative said transmitter;

signal means on said transmitter to indicate that the power circuit to be tested is powered, and that said transmitter is operative; and a receiver coupled to receive said radio frequency signals from said transmitter, said receiver including signalling means responsive to the unique pattern of the transmitted radio frequency signals;

whereby the transmitter may be connected to the power circuit to be tested, and the receiver taken to a power control point, and deactivation of the power circuit under test may be verified.

23. A system as defined in claim 22 wherein the frequency of said radio frequency signal is approximately 300 megahertz.

24. A system as defined in claim 22 wherein one of said plugs has two conductive pins for plugging into a wall socket, and wherein another of said plugs has three conductive pins for plugging into a wall socket, said system further including means for mounting the body of said transmitter transverse to orientation of said pins to hang down in a substantially vertical orientation when said plugs are plugged into said wall socket.

* * * * *